United States Patent
Cheng et al.

(10) Patent No.: US 9,263,339 B2
(45) Date of Patent: Feb. 16, 2016

(54) SELECTIVE ETCHING IN THE FORMATION OF EPITAXY REGIONS IN MOS DEVICES

(75) Inventors: Yu-Hung Cheng, Hsin-Chu (TW); Chii-Horng Li, Jhu-Bei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 77 days.

(21) Appl. No.: 12/784,344

(22) Filed: May 20, 2010

(65) Prior Publication Data

US 2011/0287600 A1    Nov. 24, 2011

(51) Int. Cl.

| H01L 21/336 | (2006.01) |
|---|---|
| H01L 21/8234 | (2006.01) |
| H01L 21/3065 | (2006.01) |
| H01L 27/11 | (2006.01) |
| H01L 29/78 | (2006.01) |
| H01L 21/02 | (2006.01) |

(52) U.S. Cl.
CPC .... *H01L 21/823425* (2013.01); *H01L 21/3065* (2013.01); *H01L 21/823412* (2013.01); *H01L 27/1116* (2013.01); *H01L 29/7848* (2013.01); *H01L 21/0262* (2013.01); *H01L 21/02532* (2013.01); *H01L 21/02639* (2013.01)

(58) Field of Classification Search
CPC ............................................. H01L 29/7848
USPC .................... 438/299; 257/E21.131
See application file for complete search history.

(56) References Cited

U.S. PATENT DOCUMENTS

| 8,299,564 | B1 | 10/2012 | Wu et al. |
| 8,647,953 | B2 | 2/2014 | Liao et al. |
| 2001/0045604 | A1* | 11/2001 | Oda et al. ............. 257/350 |
| 2005/0079691 | A1* | 4/2005 | Kim et al. ............. 438/481 |
| 2006/0038243 | A1 | 2/2006 | Ueno et al. |
| 2006/0057821 | A1 | 3/2006 | Lee et al. |
| 2006/0060856 | A1* | 3/2006 | Anderson et al. ......... 257/66 |
| 2006/0138398 | A1* | 6/2006 | Shimamune et al. ....... 257/19 |
| 2006/0151776 | A1 | 7/2006 | Hatada et al. |
| 2007/0045729 | A1 | 3/2007 | Hoentschel et al. |

(Continued)

FOREIGN PATENT DOCUMENTS

| CN | 1988110 | 6/2007 |
| TW | 200731362 | 8/2007 |

OTHER PUBLICATIONS

Isheden, C., et al., "MOSFETs with Recessed SiGe Source/Drain Junctions Formed by Selective Etching and Growth," Electrochemical and Solid-State Letters, vol. 7, No. 4, 2004, pp. G53-G55.

(Continued)

*Primary Examiner* — Matthew Landau
*Assistant Examiner* — Igwe U Anya
(74) *Attorney, Agent, or Firm* — Slater & Matsil, L.L.P.

(57) ABSTRACT

A method for forming a semiconductor structure includes forming a gate stack over a semiconductor substrate; forming a recess in the semiconductor substrate and adjacent the gate stack; and performing a selective epitaxial growth to grow a semiconductor material in the recess to form an epitaxy region. After the step of performing the selective epitaxial growth, a selective etch-back is performed to the epitaxy region. The selective etch-back is performed using process gases comprising a first gas for growing the semiconductor material, and a second gas for etching the epitaxy region.

22 Claims, 10 Drawing Sheets

(56) References Cited

U.S. PATENT DOCUMENTS

| | | |
|---|---|---|
| 2007/0054457 A1 | 3/2007 | Ueno et al. |
| 2007/0096419 A1* | 5/2007 | Gercke et al. ............ 280/93.511 |
| 2007/0105331 A1 | 5/2007 | Murthy et al. |
| 2007/0131159 A1* | 6/2007 | Kim et al. ........................ 117/58 |
| 2007/0148919 A1 | 6/2007 | Lin et al. |
| 2007/0190730 A1 | 8/2007 | Huang et al. |
| 2007/0235802 A1 | 10/2007 | Chong et al. |
| 2008/0023773 A1* | 1/2008 | Shimamune et al. ......... 257/377 |
| 2008/0233722 A1 | 9/2008 | Liao et al. |
| 2008/0237634 A1 | 10/2008 | Dyer et al. |
| 2008/0242037 A1 | 10/2008 | Sell et al. |
| 2008/0277699 A1 | 11/2008 | Chakravarthi et al. |
| 2009/0075029 A1* | 3/2009 | Thomas et al. ............... 428/173 |
| 2009/0101942 A1* | 4/2009 | Dyer ............................. 257/288 |
| 2009/0258463 A1 | 10/2009 | Kim et al. |
| 2009/0283837 A1 | 11/2009 | Huebinger et al. |
| 2010/0035419 A1 | 2/2010 | Dube et al. |
| 2010/0093147 A1* | 4/2010 | Liao et al. .................... 438/300 |
| 2010/0105184 A1 | 4/2010 | Fukuda et al. |
| 2010/0148217 A1 | 6/2010 | Simonelli et al. |
| 2010/0167505 A1* | 7/2010 | Chew et al. .................. 438/503 |
| 2010/0264470 A1 | 10/2010 | Thirupapuliyur et al. |
| 2010/0295127 A1 | 11/2010 | Cheng et al. |
| 2011/0008951 A1 | 1/2011 | Chen et al. |
| 2011/0108894 A1 | 5/2011 | Sung et al. |
| 2011/0117732 A1* | 5/2011 | Bauer et al. ................... 438/507 |
| 2011/0287611 A1 | 11/2011 | Cheng et al. |
| 2013/0252392 A1 | 9/2013 | Cheng et al. |

OTHER PUBLICATIONS

Ito, S., et al., "Pattern dependence in selective epitaxial $Si_{1-x}Ge_x$ growth using reduced-pressue chemical vapor deposition," J. Appl. Phys. 78 (4), Aug. 15, 1995, American Institute of Physics, pp. 2716-2719.

Bodnar, S. et al., "Selective Si and SiGe epitaxial heterostructures grown using an industrial low-pressure chemical vapor deposition module," J. Vac. Sci. Technol. B 15 (3), May/Jun. 1997, American Vacuum Society, pp. 712-718.

Menon, C., et al., "Loading effect in SiGe layers grown by dichlorosilane- and silane-based epitaxy," J. Appl. Phys. 90 (9), Nov. 1, 2001, American Institute of Physics, pp. 4805-4809.

* cited by examiner

US 9,263,339 B2

SELECTIVE ETCHING IN THE FORMATION OF EPITAXY REGIONS IN MOS DEVICES

TECHNICAL FIELD

This disclosure relates generally to the formation of integrated circuit devices, and more particularly to the selective etching in the formation of epitaxy regions in metal-oxide-semiconductor (MOS) devices.

BACKGROUND

To enhance the performance of metal-oxide-semiconductor (MOS) devices, stress may be introduced in the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying compressive stress to the channel regions of PMOS devices is growing SiGe stressors in the source and drain regions. Such a method typically includes the steps of forming a gate stack on a silicon substrate, forming spacers on sidewalls of the gate stack, forming recesses in the silicon substrate and adjacent the gate spacers, and epitaxially growing SiGe stressors in the recesses. An annealing is then performed. Since SiGe has a greater lattice constant than silicon, it expands after annealing and applies a compressive stress to the channel region of the respective MOS device, which is located between a source SiGe stressor and a drain SiGe stressor.

A chip may have different regions having different pattern densities. Due to the pattern loading effect, the growth of SiGe stressors in different regions may have different rates. For example, FIG. 1 illustrates the formation of SiGe regions for PMOS devices in logic device region 300 and static random access memory (SRAM) region 400. Since the pattern density of the PMOS devices in SRAM region 400 is generally higher than the pattern density of the PMOS devices in SRAM region 300, and the sizes of SiGe regions 410 are typically smaller than the sizes of SiGe regions 310, SiGe regions 410 are grown faster than SiGe regions 310. As a result, height H2, which is the height of the portions of SiGe regions 410 over the top surface of substrate 320, may be significantly greater than height H1 of SiGe regions 310. For example, height H2 may be about 20 nm, while height H1 may be only about 5 nm, even if SiGe regions 310 and 410 are formed simultaneously. With the great height H2 and the small horizontal sizes, SiGe regions 410 may have pyramid top portions, with the slopes of the top portions being on (111) planes. This creates significant problems for the subsequent process steps such as the formation of source and drain silicide regions.

SUMMARY

In accordance with one aspect, a method for forming a semiconductor structure includes forming a gate stack over a semiconductor substrate; forming a recess in the semiconductor substrate and adjacent the gate stack; and performing a selective epitaxial growth to grow a semiconductor material in the recess to form an epitaxy region. After the step of performing the selective epitaxial growth, a selective etch-back is performed to the epitaxy region. The selective etch-back is performed using process gases comprising a first gas for growing the semiconductor material, and a second gas for etching the epitaxy region.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming metal-oxide-semiconductor (MOS) devices with stressed channel regions is provided. The intermediate stages of manufacturing an embodiment are illustrated. Throughout the various views and illustrative embodiments, like reference numbers are used to designate like elements.

Figure 1:
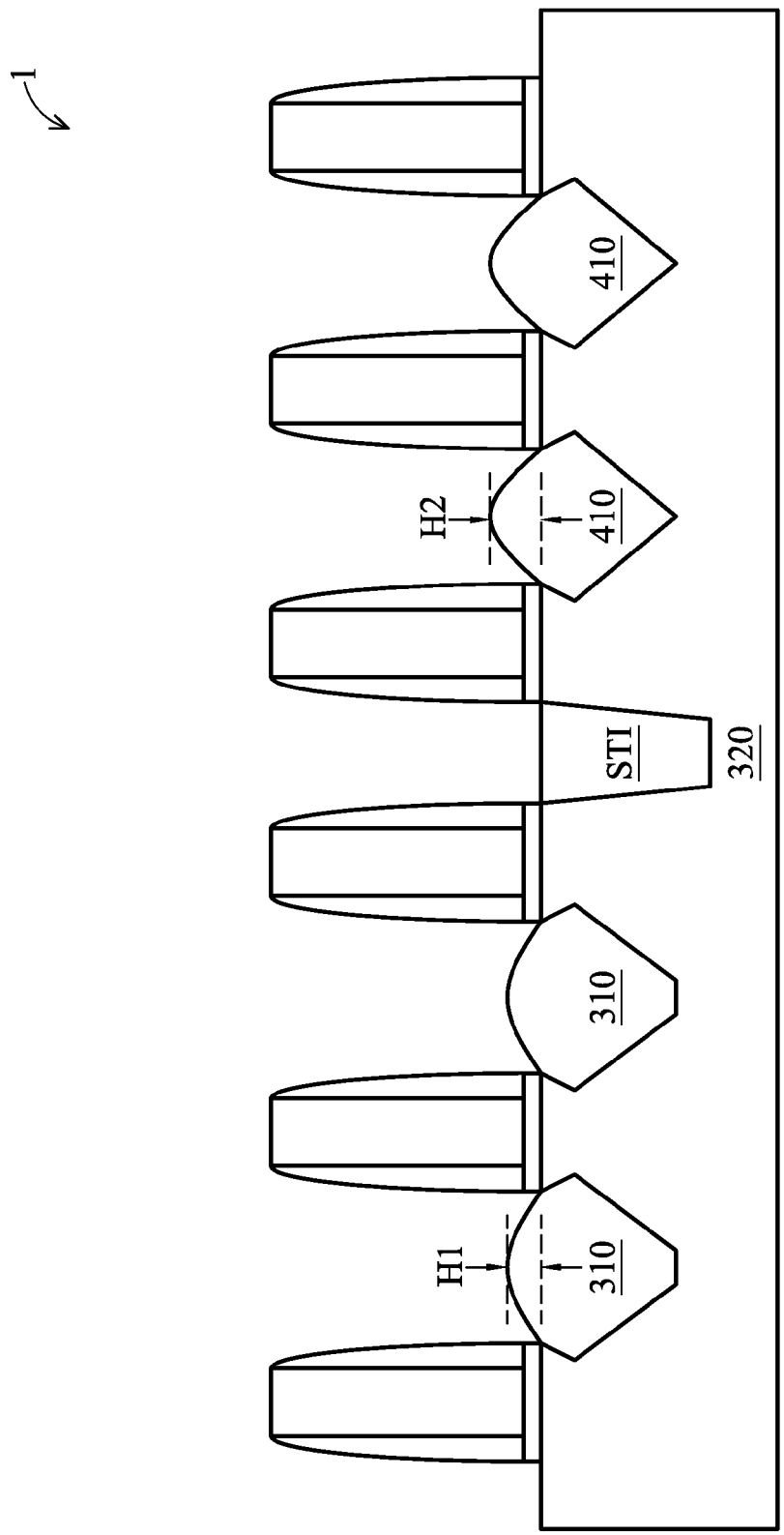
FIG. 1 illustrates a cross-sectional view of an intermediate stage in the formation of a conventional integrated structure comprising PMOS devices, wherein SiGe stressors in different device regions have different heights due to the pattern-loading effect.
Figure 2:
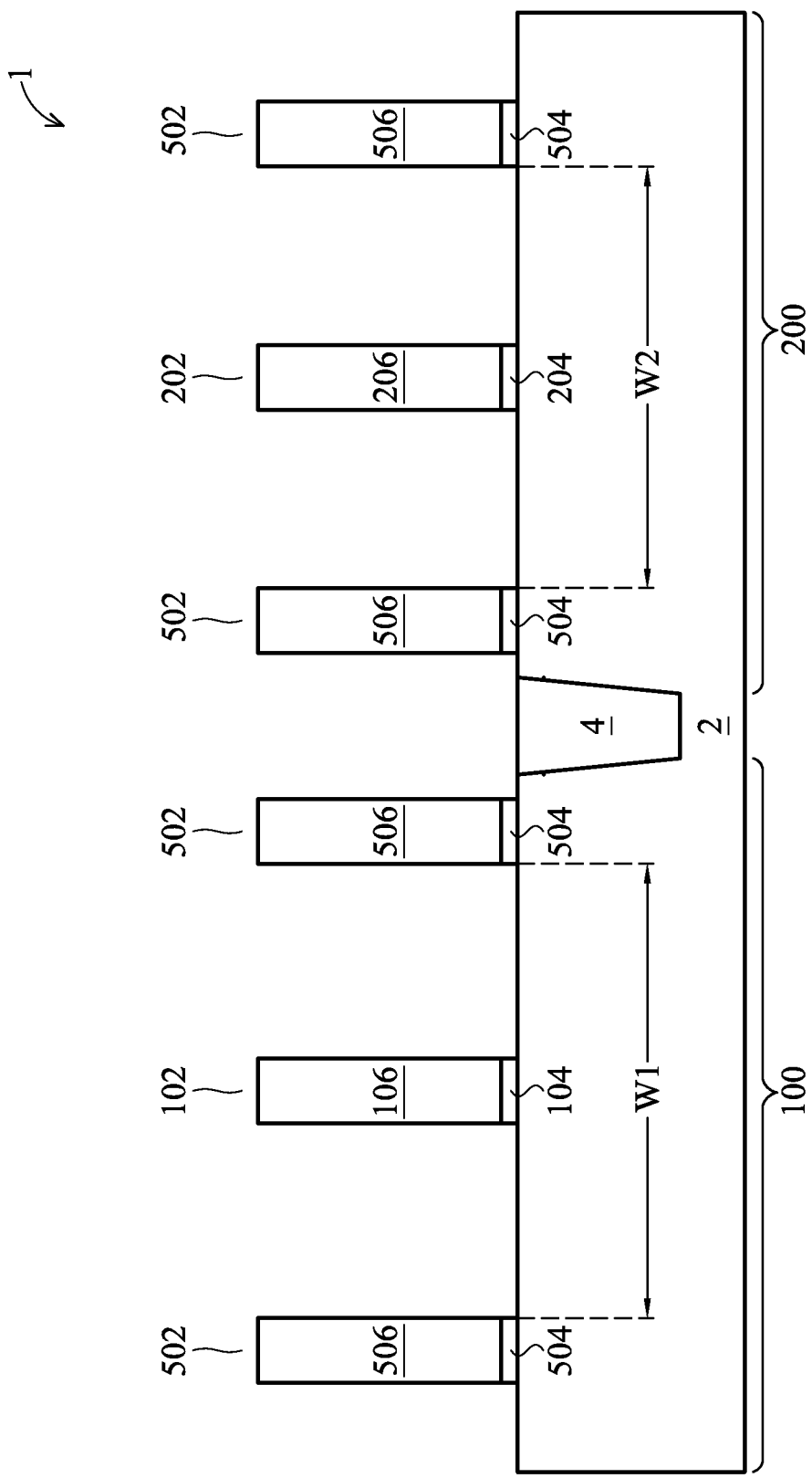
FIGS. 2 through 9 are cross-sectional views of intermediate stages in the manufacturing of an integrated structure in accordance with an embodiment, wherein a selective etch-back is performed to reduce the pattern-loading effect.

FIG. 2 illustrates substrate 2, which may be a portion of wafer 1 that comprises a first portion in device region 100 and a second portion in device region 200. In an embodiment, device region 100 is a logic device region, which may be, for example, a core circuit region, an input/output (I/O) circuit region, and/or the like, while device region 200 is a memory circuit region comprising memory cells such as static random access memory (SRAM) cells. Accordingly, device region 200 may be an SRAM region. In alternative embodiments, device region 100 is a region with a lower density of devices (such as transistors) than device region 200. The size of active region 101 in device region 100 may be greater than the size of active region 201 in device region 200. For example, the length (which is the size of the active region in the direction perpendicular to the illustrated width W1) of active region 101 may be about 5 times to about 30 times the respective length of active region 201. If viewed from top, active region 101 may appear to be a long strip, with width W1 being the smaller dimension of the strip. Active region 201, on the other hand, may have the shape of a square, or the shape of a rectangle with close width (W2) and length. Shallow trench isolation (STI) regions 4 are formed to isolate device regions 100 and 200. Substrate 2 may comprise bulk semiconductor material such as silicon, or have a composite structure, such as silicon-on-insulator (SOI) structure.

Gate stack 102 comprising gate dielectric 104 and gate electrode 106 is formed in device region 100 and over substrate 2. Gate stack 202 comprising gate dielectric 204 and gate electrode 206 is formed in device region 200 and over substrate 2. Gate dielectrics 104 and 204 may comprise silicon oxide or high-k materials having high k values, for example, higher than about 7. Gate electrodes 106 and 206 may include commonly used conductive materials such as doped polysilicon, metals, metal silicides, metal nitrides, and combinations thereof. Further, dummy gate stacks 502 includes dummy gate dielectrics 504 and dummy gate electrodes 506, wherein dummy gate electrodes 506 may be electrically floating.

Figure 3:
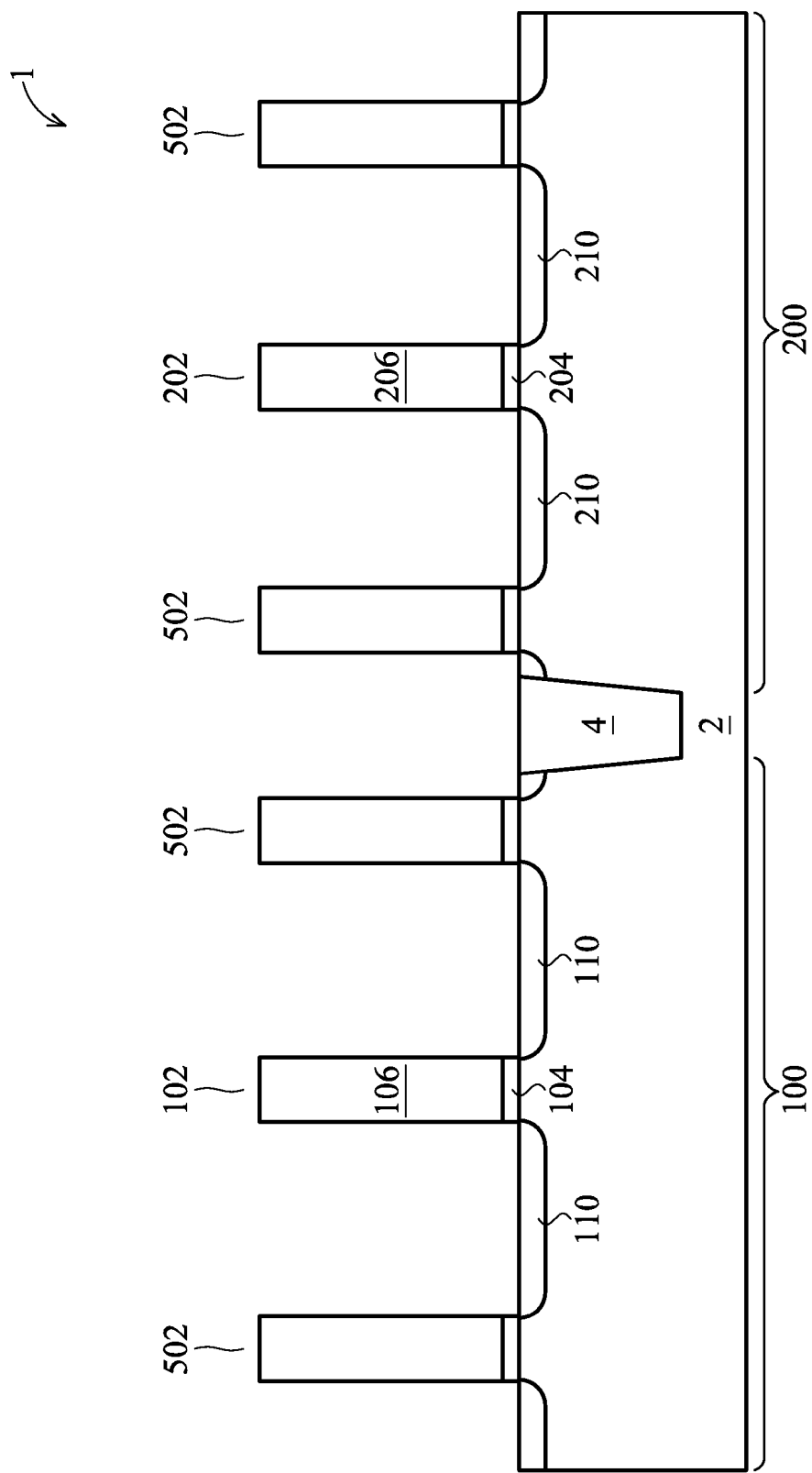

Referring to FIG. 3, lightly doped drain/source (LDD) regions 110 and 210 are formed, for example, by implanting a p-type impurity. Gate stacks 102 and 202 act as masks so that the inner edges of LDD regions 110 and 210 are substantially aligned with the edges of gate stacks 102 and 202, respectively.

Figure 4:
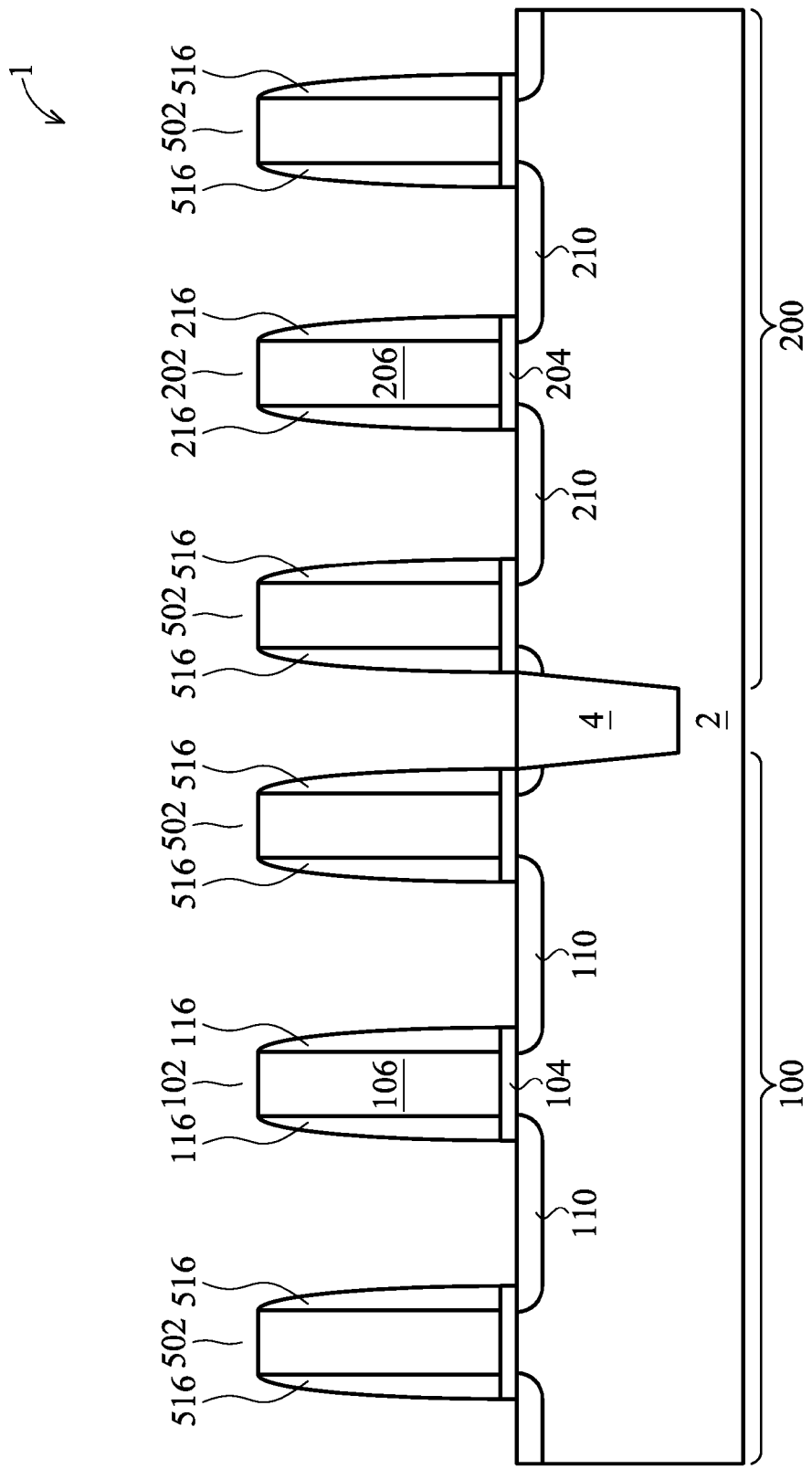

Referring to FIG. 4, gate spacers 116 and 216, and dummy gate spacers 516, are formed. In an embodiment, each of gate spacers 116 and 216 includes a liner oxide layer and a nitride layer over the liner oxide layer. In alternative embodiments, each of gate spacers 116 and 216 may include one or more layers, each comprising oxide, silicon nitride, silicon oxynitride (SiON) and/or other dielectric materials, and may be formed using commonly used techniques, such as plasma enhanced chemical vapor deposition (PECVD), low-pressure chemical vapor deposition (LPCVD), sub-atmospheric chemical vapor deposition (SACVD), or the like. The formation of gate spacers 116 and 216 may include blanket forming gate spacer layers, and then performing etching steps to remove the horizontal portions of the gate spacer layers, so that the remaining vertical portions of the gate spacer layers form gate spacers 116 and 216.

Figure 5:
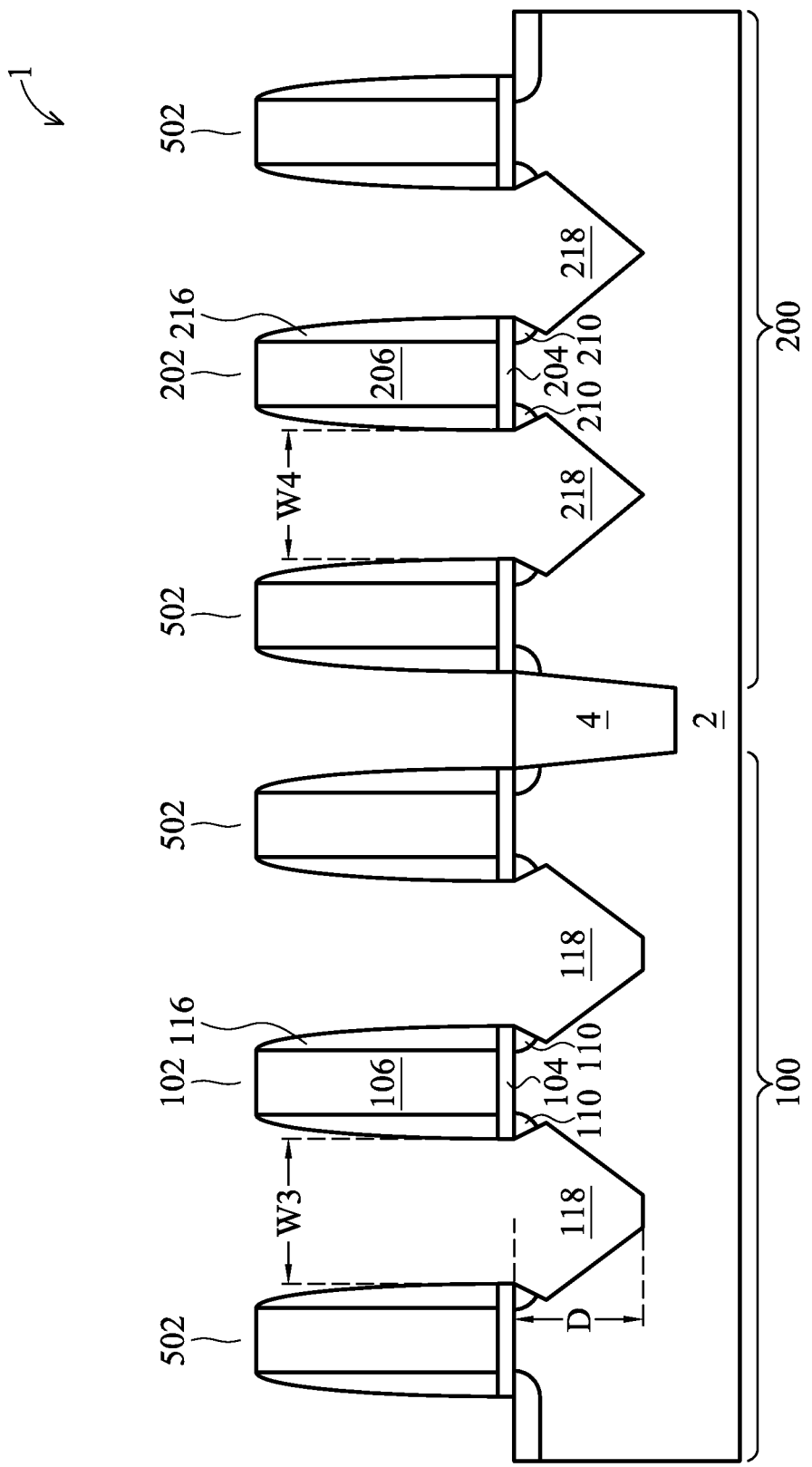

Referring to FIG. 5, recesses 118 and 218 are formed by etching substrate 2 isotropically or anisotropically. Depth D of recesses 118 and 218 may be between about 500 Å and about 1000 Å, although different depth D may also be used. One skilled in the art will realize, however, that the dimensions recited throughout the description are merely examples, and will change if different formation technologies are used. In an embodiment, recesses 118 have a spear shape in the cross-sectional view. The bottom portion of each of recesses 118 and 218 has an upside-down pyramid shape in a perspective view. However, other shapes may also be resulted, depending on the methods and process conditions used in the etching process.

Figure 6:
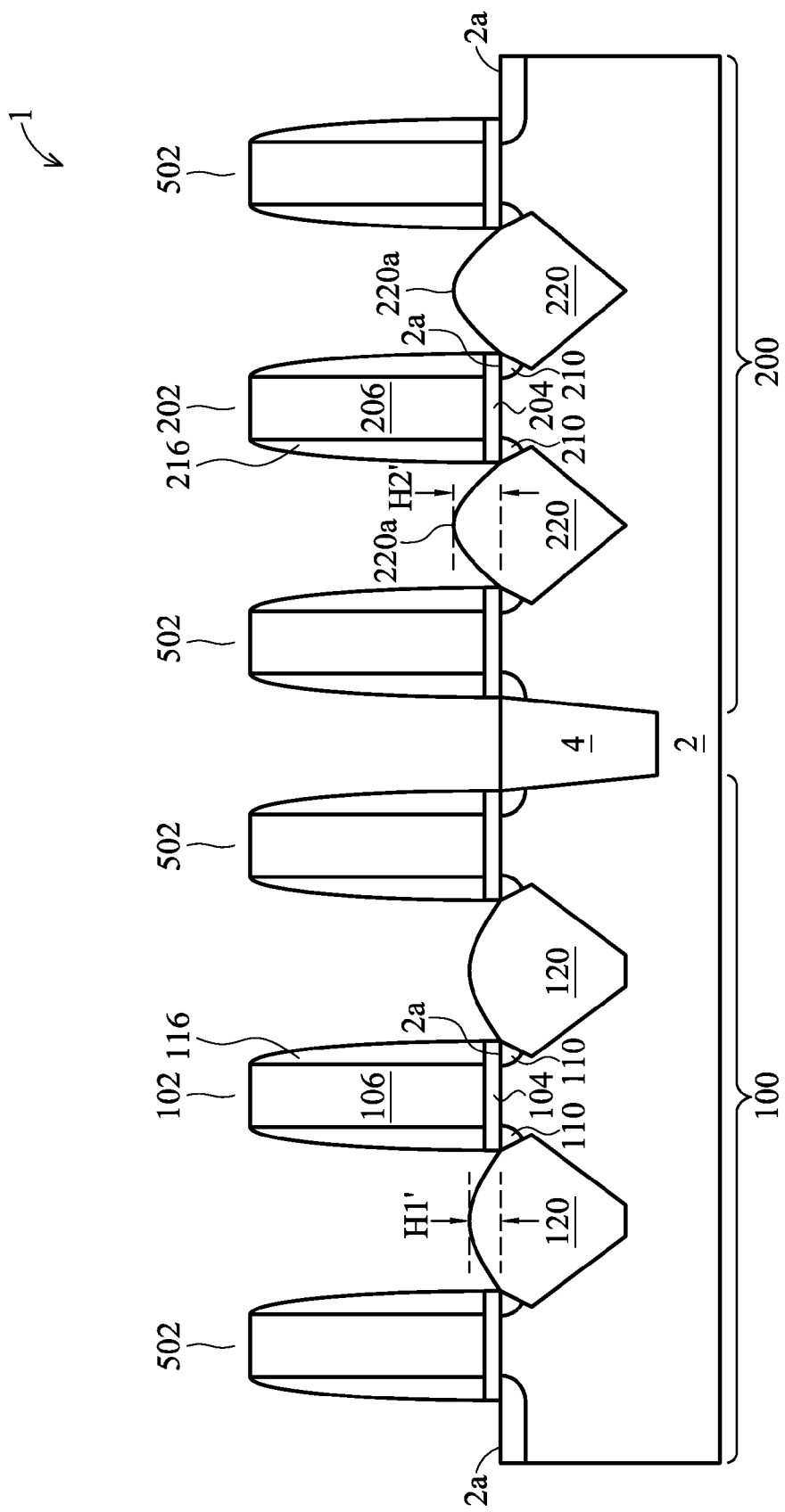

FIG. 6 illustrates the formation of epitaxy regions. A semiconductor material, such as silicon germanium (SiGe), is epitaxially grown in recesses 118 and 218 by a selective epitaxial growth (SEG), forming epitaxy regions 120 and 220. The semiconductor material may have a greater lattice constant than silicon substrate 2. Desired impurities may be, or may not be, doped while the epitaxial growth proceeds. After being annealed, SiGe will try to restore its lattice constant, thus introducing compressive stresses to the channel regions of the resulting PMOS devices. Throughout the description, SiGe epitaxy regions 120 and 220 are alternatively referred to as SiGe stressors 120 and 220, respectively.

The precursor for growing SiGe may include growth gases such as germane ($GeH_4$, which provides germanium), dichloro-silane (DCS, which provides silicon), Furthermore, a carbon containing silicon-source (such as Monomethylsilane ($SiCH_3$) or $SiC_xH_{4-x}$) and/or a carbon containing germane-source (such as $GeCH_3$ or $GeC_xH_{4-x}$) may be added. An etching gas selected from HCl, HF, $Cl_2$, and combinations thereof, is introduced for removing the undesirable SiGe portions grown on dielectric materials such as gate spacers 116 and 216 and STI regions 4. Alternatively, the etching gas comprises a gas selected from the group consisting essentially of $C_xF_yH_z$, $C_xCl_yH_z$, $Si_xF_yH_z$, $Si_xCl_yH_z$, with values x, y, and z represent the percentage of the respective elements. The etching gas also has the effect of reducing pattern-loading effects. Accordingly, during the epitaxial growth, both growth and etch co-exist. However, the growth rate is greater than the etch rate, and hence the net effect is growth. In an exemplary embodiment, the selective growth is performed using low pressure chemical vapor deposition (LPCVD) in a chamber, in which the total pressure of gases may be between about 1 torr and about 200 torrs, or between about 3 torrs and 50 torrs. During the selective growth, the temperature of wafer 1 may be between about 500° C. and about 800° C., for example.

Due to the pattern-loading effects, which may be caused by different width W3 and W4 of recesses 118 and 218, respectively, as shown in FIG. 5, the planes of (111) facets of SiGe stressors 120 and 220 will pin in epitaxy regions 120 and 220, respectively. Accordingly, SiGe stressors 120 and 220 may have the (111) planes. Furthermore, SiGe stressors 120 have a lower growth rate than SiGe stressors 220. Accordingly, the portions of SiGe stressors 120 over the top surface 2a of substrate 2 has height H1' that is smaller than height H2' of the portion of SiGe stressors 220 over top surface 2a of substrate 2. The portions of SiGe stressors 220 over the top surface 2a of substrate 2 may have a pyramid, or close to a pyramid shape, with the slopes of the pyramid having (111) surface planes. The difference in heights H1' and H2' and the non-flat top surface profile, particularly that of SiGe stressors 220, cause process difficulty in subsequent device fabrication processes, and may adversely affect device performance.

Figure 7:
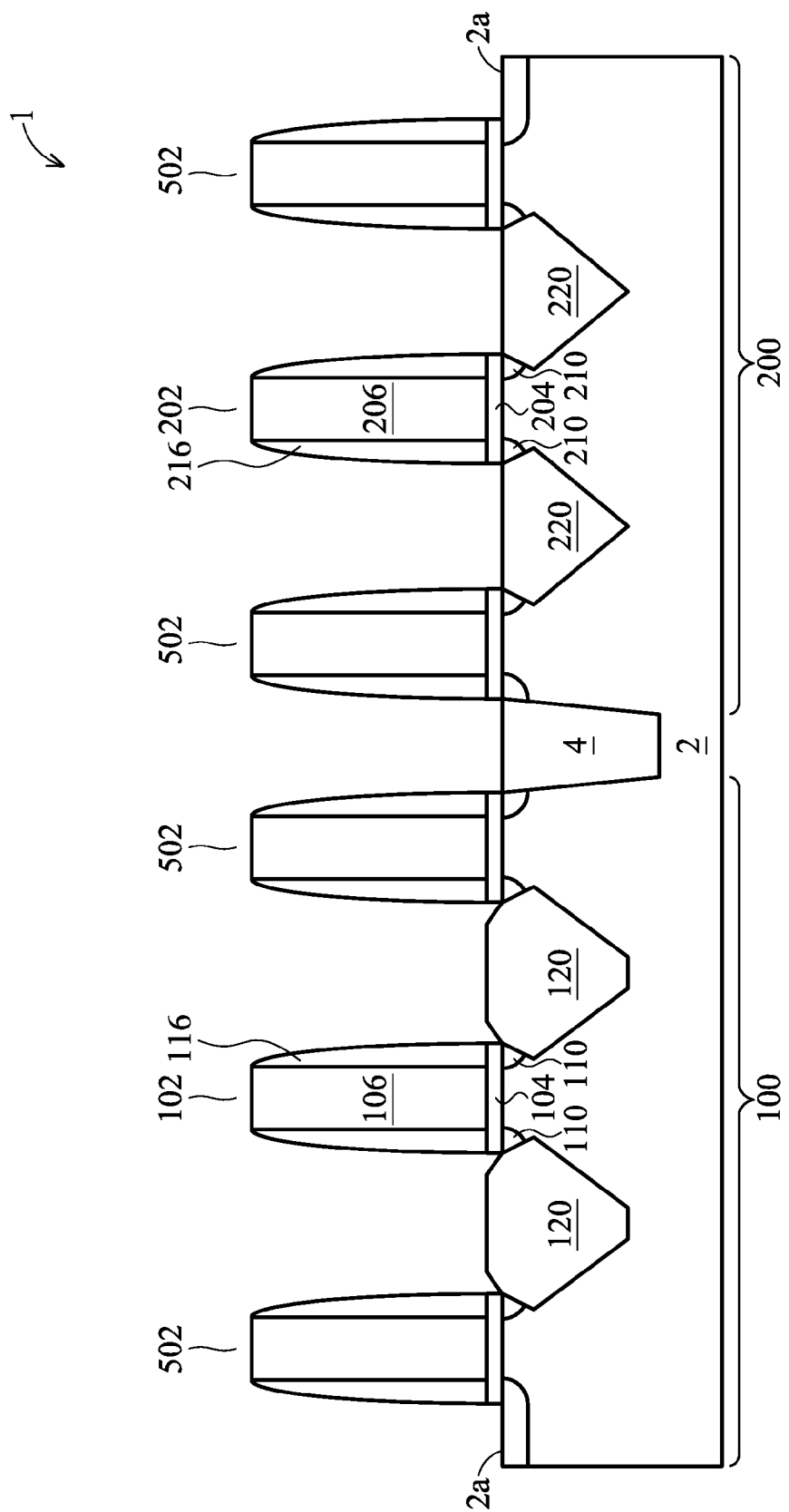

As shown in FIG. 7, in an embodiment, after the top ends of SiGe stressors 220 are higher than top surface 2a of substrate 2, a selective etch-back is performed to etch back SiGe stressors 220. Alternatively, at the time the etch-back process starts, the top ends 220A of SiGe stressors 220 (refer to FIG. 6) may be level with or lower than top surface 2a of substrate 2. In an exemplary embodiment, the etch-back process is started when the top portions of SiGe stressors 220 have a near-pyramid shape, wherein the top portions are over surface 2a of substrate 2.

The selective etch-back and the selective growth of SiGe stressors 120 and 220 may be in-situ performed, that is, there is no vacuum break between the selective etch-back and the selective growth. Further, wafer 1 is not taken out of the chamber in which the selective growth is performed. Accordingly, the transition from the selective growth to the selective etch-back may be performed by adjusting process conditions such as the compositions and the pressures of process gases, the temperature of wafer 1, and the like.

In an embodiment, to achieve the transition between the selective growth and the selective etch-back, the partial pressure and the flow rate of the etching gas such as HCl is increased to increase the etch effect. In the mean time, the growth gases, such as DCS and $GeH_4$, which are used for the growth of SiGe are still being introduced. Further, a carbon-containing silicon source and/or a carbon-containing germane source may be included in the processes. Accordingly, during the selective etch-back process, both the growth and the etch-back co-exist, with the etch-back rate higher than the growth rate, so that the net effect is the etch-back, at least for SiGe stressors 220. Again, at the time SiGe stressors 220 is etched, due to the pattern-loading effects, the etch effect for SiGe stressors 120 is weaker than for SiGe stressors 220, and hence the net effect for SiGe stressors 120 may be a continued grow, an etch back, or no growth and no etch back, depending on process conditions in the selective etch-back.

To determine the optimum conditions for the selective etch-back, an etch-back to growth ratio (E/G ratio) may be used to estimate the process conditions. The E/G ratio is the ratio of the partial pressure of etch-back gas(es) (such as HCl) to the weighted partial pressure of the growth gas(es) (such as GeH$_4$ and DCS). In an exemplary embodiment, the E/G ratio may be expressed as E/G ratio=$P_{HCl}/(P_{DCS}+100 \times P_{GeH4})$, with $P_{HCl}$, $P_{DCS}$, and $P_{GeH4}$ being the partial pressures of HCl, DCS, and GeH$_4$, respectively. The value "100" represents a weight of GeH$_4$. It was observed that GeH$_4$ has a much higher effect to the growth than DCS. In other words, to increase the growth rate, it is much more effective to introduce more GeH$_4$ than to introduce more DCS. The weight 100 thus indicates the significantly greater effect of GeH$_4$ over DCS, although an optimum weight may be different. An exemplary E/G ratio may be between about 0.4 and 2.0. The optimum E/G ratio for the selective etch-back may be found through experiments.

Figure 10:
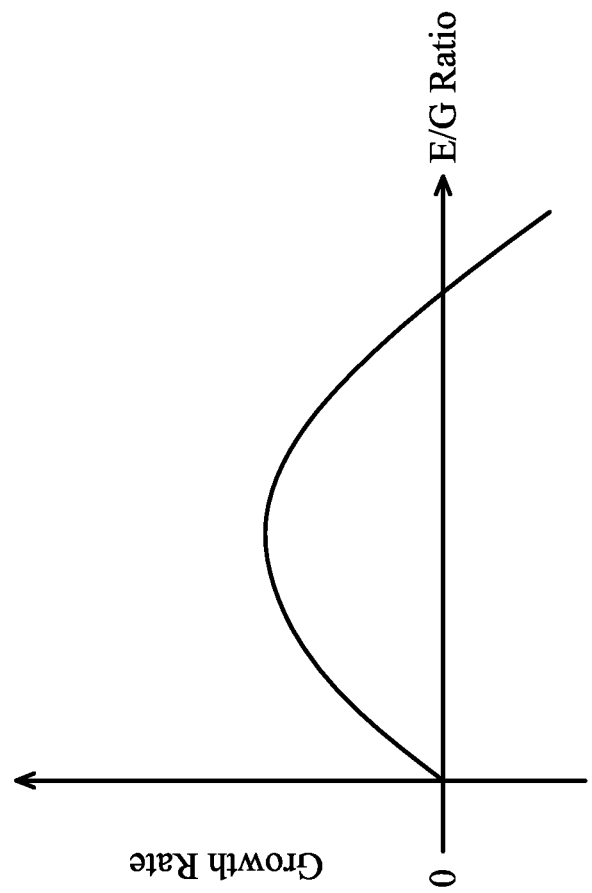
FIG. 10 illustrates the growth rate of silicon germanium as a function of a ratio of the partial pressure of etching gas to the weighted partial pressure of growth gases.

FIG. 10 schematically illustrates the effect of the E/G ratio to the growth/etch rate of SiGe, wherein the X-axis represents the E/G ratio, and the Y-axis represents the growth/etch rate of SiGe. Positive values represent the effect of net growth, and negative values represent the effect of net etch-back. It was observed that when the E/G ratio is low, with the increase in the partial pressure of HCl, contrary to one would have expected, the growth rate of SiGe increases rather than decreases. With the further increase in the E/G ratio, the growth rate of SiGe decreases, although the net effect is still growth. Further increasing the E/G ratio, the effect of etch-back exceeds the effect of growth, and the net effect becomes etch back.

The transition from selective growth to selective etch-back and the optimum etch back conditions may be achieved by increasing the partial pressure of DCS and/or reducing the partial pressure of GeH$_4$, increasing the total pressure of process gases, and increasing the temperature of wafer 1. In an exemplary embodiment, the temperature of wafer 1 during the selective etch-back is between about 500° C. and 800° C., or between about 600° C. and 700° C. The duration of the selective etch-back may be between about 3 seconds and about 600 seconds, or between about 3 seconds and about 50 seconds. The total pressure of the process gases may be between about 1 torr and about 200 torrs.

During the etch back process, desirable reversed pattern-loading effects occur, wherein an etching rate of SiGe stressors 120 is at least lower than the etching rate of SiGe stressors 220. Accordingly, the undesirable pyramids of SiGe stressors 220 are eliminated. The resulting SiGe stressors 220 may have a better profile, which may include substantially flat top surfaces, as shown in FIG. 7. Accordingly, the facets of SiGe stressors 120 and/or 220 may be at least reduced, and possibly substantially eliminated.

In an embodiment, SiGe stressors 120 and 220 are over-grown and etched back to the desired thickness in one growth-etch cycle. In other embodiments, the formation of SiGe stressors 120 and 220 includes multiple cycles of growth and etch back to achieve better SiGe surface profile for both SiGe stressors 120 and 220. The additional growth-etch cycles are essentially similar to what is shown in FIGS. 6 and 7, and hence are not shown herein.

Figure 8:
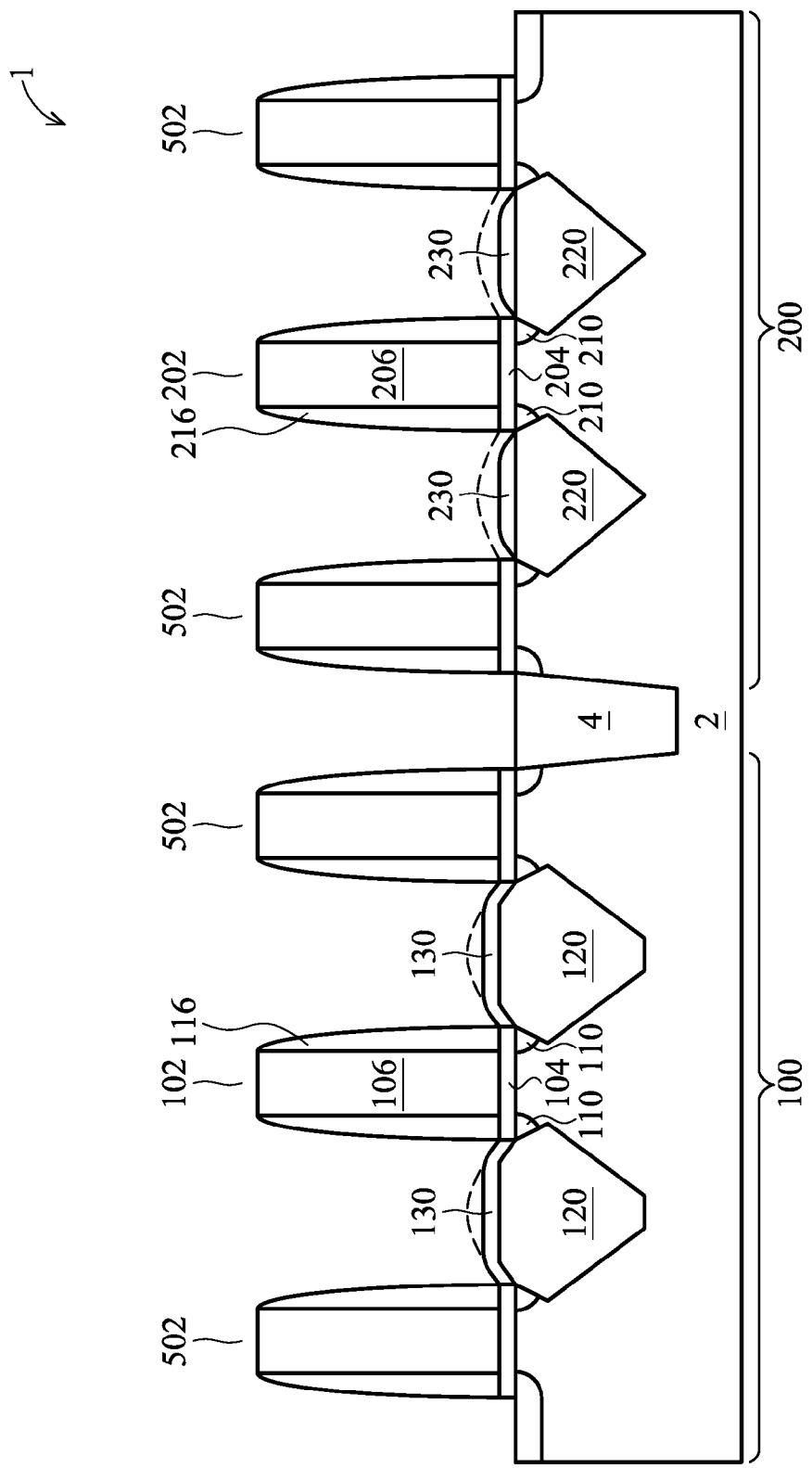

FIG. 8 illustrates the formation of silicon caps or SiGe caps 130 and 230 (referred to as Si/SiGe caps, or silicon-containing caps hereinafter), which may also be formed using selective epitaxial growth. When germanium is contained in silicon-containing caps, the germanium atomic percentage in silicon-containing caps 130 and 230 will be lower than the germanium atomic percentage in the respective underlying SiGe regions 120 and 220, respectively. Further, the germanium atomic percentage in silicon-containing caps 130 and 230 may be lower than about 20 percent. Silicon-containing caps 130 and 230 are beneficial for the subsequent formation of source and drain silicide regions due to the low resistivity of silicide formed on silicon rather than on SiGe. The process gases for forming silicon-containing caps 130 and 230 may include silane (SiH$_4$) and HCl. Again, in the selective growth of silicon-containing caps 130 and 230, both growth and etch back exist, while the net effect is growth. Facets may also be formed on silicon-containing caps 130 and 230. Accordingly, similar to the formation of SiGe regions 120 and 220, after the selective growth of silicon-containing caps 130 and 230, an optional selective etch-back may be performed to reduce the pattern-loading effect and to improve the profiles of silicon-containing caps 130 and 230. The dotted lines schematically illustrate the profile of silicon-containing caps 130 and 230 at the time the selective etch-back starts, while the profile of silicon-containing caps 130 and 230 after the selective etch-back is illustrated using solid lines. Again, the selective etch-back of silicon-containing caps 130 and 230 may be in-situ performed with the respective selective growth. In the selective etch-back of silicon-containing caps 130 and 230, both growth and etch-back exist, while the net effect is etch-back. The transition from selective growth to selective etch-back may be achieved by adjusting the process conditions such as increasing the partial pressure of HCl and/or reducing the partial pressure of silane.

Figure 9:
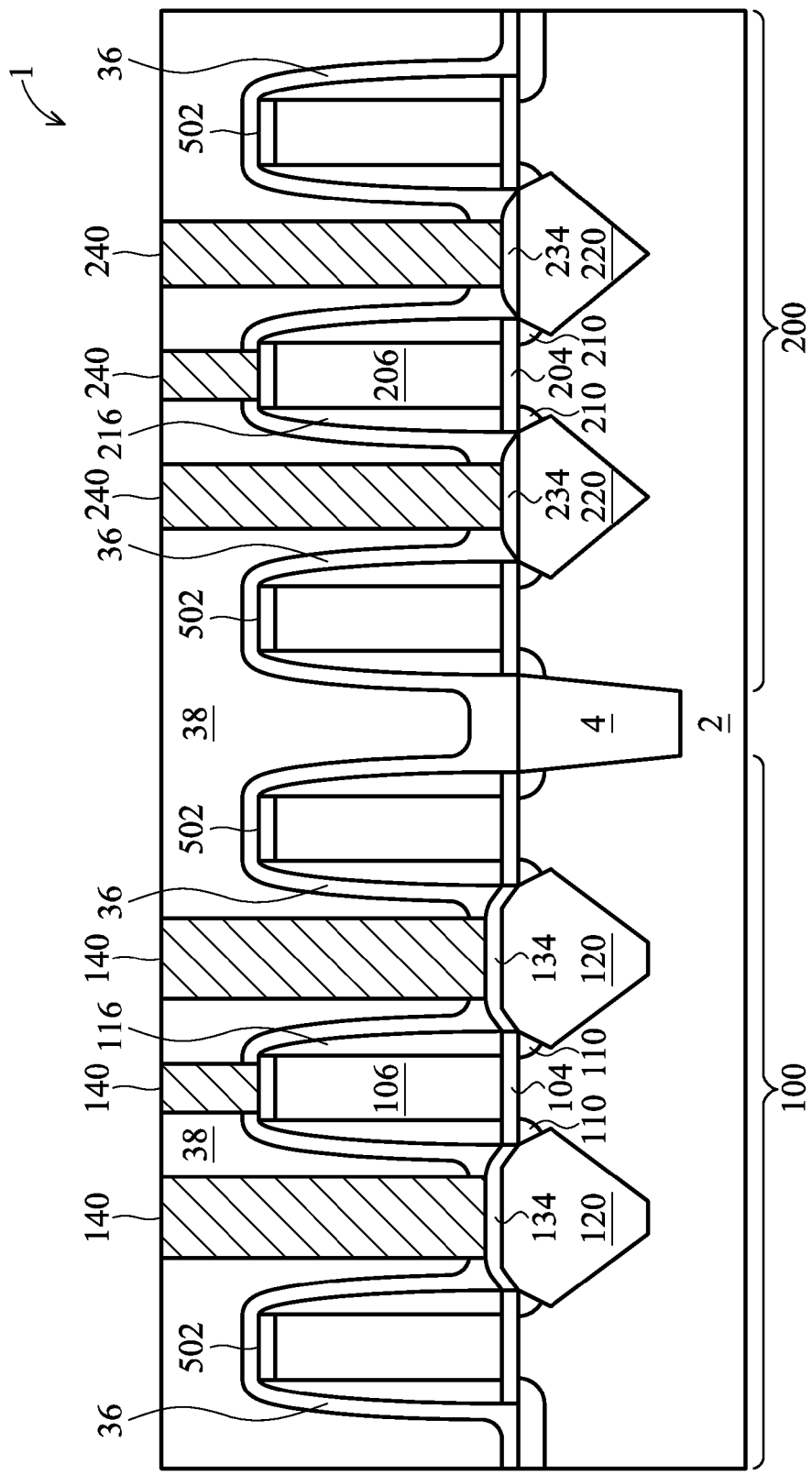

FIG. 9 illustrates the formation of silicide regions 134 and 234, etch stop layer (ESL) 36, and contact plugs 140 and 240. Silicide regions 134 and 234 may be formed by depositing a thin layer of metal, such as titanium, cobalt, nickel, or the like, over the devices, including the exposed surfaces of silicon-containing caps 130 and 230 and gate electrode 106 and 206. Wafer 1 is then heated, which causes the silicide reaction to occur wherever the metal is in contact with silicon. After the reaction, a layer of metal silicide is formed between silicon and metal. The un-reacted metal is selectively removed through the use of an etchant that attacks metal but does not attack silicide. Further, no contact plugs are formed to connect to dummy gate stacks 502.

ESL 36 is blanket deposited. ESL 36 may be formed using plasma enhanced chemical vapor deposition (PECVD), but other CVD methods, such as low pressure chemical vapor deposition (LPCVD), and thermal CVD may also be used. Inter-level dielectric (ILD) 38 is next deposited. ILD layer 38 may comprise boronphospho-silicate glass (BPSG) or other applicable materials. ILD layer 38 provides insulation between MOS devices and overlying metal lines. Contact plugs 140 and 240 are then formed providing access to the source/drain region and gate electrodes through silicide regions 134 and 234.

In the above-discussed embodiments, the growth of SiGe stressors for planar devices is illustrated. The teaching, however, may also be applied to the growth of SiGe stressors for fin field-effect transistors (FinFETs). The process may include forming a gate stack on a semiconductor fin (not shown), etching the exposed portions of the semiconductor fin not covered by the gate stack, and performing a selective growth followed by a selective etch-back to form SiGe stressors. The process details may be realized through the teaching in the embodiments, and hence are not discussed herein. In addition, the teaching of the embodiments may also be applied to the formation of stressors (such as SiC stressors) for NMOS devices. The selective etch-back as discussed in the preceding embodiments, besides used for the formation of CMOS devices, may also be used for the formation other devices such as solar cell, micro-electro-mechanical-systems (MEMS) devices.

In the embodiments, by reducing pattern-loading effects through the selective etch-back processes, more uniform formation of epitaxy regions (such as SiGe stressors) is achieved, and the profiles of the epitaxy regions are improved. The facets of the epitaxy regions can be reduced, or even substantially eliminated. Additionally, the selective etch-back can be performed in-situ with the selective growth, thus minimal extra cost is involved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor structure, the method comprising:
    forming a gate stack over a semiconductor substrate, the semiconductor substrate having a first lattice constant;
    forming a recess in the semiconductor substrate and adjacent the gate stack;
    performing a first selective epitaxial growth to grow a first semiconductor material in the recess and adjoining a bottom-most surface of the recess, the first selective epitaxial growth substantially only growing the first semiconductor material from one or more crystalline surface, the bottom-most surface of the recess comprising a surface of the semiconductor substrate, the first semiconductor material having a second lattice constant;
    after the step of performing the first selective epitaxial growth, performing a selective etch-back on the first semiconductor material, wherein the selective etch-back is performed using process gases comprising a first gas for growing the first semiconductor material, and a second gas for etching the first semiconductor material, wherein after the selective etch-back is performed at least a portion of a top surface of the first semiconductor material is at or above a top surface of the semiconductor substrate; and
    performing a second selective epitaxial growth to grow a second semiconductor material adjoining the first semiconductor material to form a cap region, the second selective epitaxial growth substantially only growing the second semiconductor material from one or more crystalline surface, the second semiconductor material having a third lattice constant, a magnitude of a difference between the first lattice constant and the second lattice constant being greater than a magnitude of a difference between the first lattice constant and the third lattice constant.

2. The method of claim 1, wherein the first gas comprises germane ($GeH_4$) and dichloro silane (DCS), and the second gas comprises hydrogen chloride (HCl), HF, $Cl_2$, $C_xF_yH_z$, $C_xCl_yH_z$, $Si_xF_yH_z$, or $Si_xCl_yH_z$.

3. The method of claim 2 further comprising a carbon containing silicon-source or a carbon containing germane-source.

4. The method of claim 3, wherein the carbon containing silicon-source comprises monomethylsilane ($SiCH_3$) or $SiC_xH_{4-x}$, and the carbon containing germane-source comprises $GeCH_3$ or $GeC_xH_{4-x}$.

5. The method of claim 1, wherein both the first and the second gases are selected from the group consisting essentially of $GeH_4$, HCl, dichloro silane, and combinations thereof.

6. The method of claim 1, wherein the step of performing the first selective epitaxial growth and the step of performing the selective etch-back are in-situ performed.

7. The method of claim 1, wherein the performing the second selective epitaxial growth to form the cap region is performed after the step of performing the selective etch-back, the cap region being a silicon-containing cap over the first semiconductor material, wherein the step of forming the silicon-containing cap comprises:
    after the step of performing the second selective epitaxial growth to form the cap region, performing an additional selective etch-back to the silicon-containing cap.

8. The method of claim 1 further comprising, after the step of performing the selective etch-back, performing a cycle comprising:
    performing an additional selective epitaxial growth to increase a thickness of the first semiconductor material; and
    after the step of performing the additional selective epitaxial growth, performing an additional selective etch-back to further reduce the thickness of the first semiconductor material.

9. The method of claim 1, wherein the semiconductor substrate and the second semiconductor material are each silicon.

10. A method for forming a semiconductor structure, the method comprising:
    providing a semiconductor substrate comprising a first portion in a first device region and a second portion in a second device region;
    forming a first gate stack in the first device region and over the semiconductor substrate;
    forming a second gate stack in the second device region and over the semiconductor substrate;
    forming a first recess in the semiconductor substrate and adjacent the first gate stack, and a second recess in the semiconductor substrate and adjacent the second gate stack;
    performing a selective epitaxial growth to simultaneously grow a first epitaxy material in the first recess and a second epitaxy material in the second recess, with the second epitaxy material having a greater growth rate than the first epitaxy material, the second epitaxy material adjoining a bottom-most surface of the second recess; and
    after the step of performing the selective epitaxial growth, performing a selective etch-back to etch the second epitaxy material, wherein the step of performing the selective epitaxial growth and the step of performing the selective etch-back are in-situ performed, wherein after the selective etch-back is performed at least a portion of a top surface of the second epitaxy material is at or above a top surface of the semiconductor substrate.

11. The method of claim 10, wherein each of the steps of performing the selective epitaxial growth and performing the selective etch-back are performed using a growth gas comprising germane ($GeH_4$), dichloro silane (DCS), and an etching gas comprising HCl, HF, or $Cl_2$, with partial pressures of the growth gas and the etching gas in the step of performing the selective epitaxial growth being different from partial pressures of the growth gas and the etching gas, respectively, in the step of performing the selective etch-back.

12. The method of claim 11, wherein a transition from the step of performing the selective epitaxial growth to the step of performing the selective etch-back comprises increasing a partial pressure of HCl, HF, or $Cl_2$.

13. The method of claim 11, wherein a transition from the step of performing the selective epitaxial growth to the step of performing the selective etch-back comprises increasing a partial pressure of DCS.

14. The method of claim 13, wherein a transition from the step of performing the selective epitaxial growth to the step of performing the selective etch-back comprises reducing a partial pressure of $GeH_4$ to a non-zero value.

15. The method of claim 10, wherein during the step of performing the selective etch-back, a thickness of the first epitaxy material increases.

16. The method of claim 10, wherein during the step of performing the selective etch-back, a thickness of the first epitaxy material is substantially unchanged.

17. The method of claim 10, wherein during the step of performing the selective etch-back, a thickness of the first epitaxy material decreases.

18. The method of claim 10, wherein the performing the selective etch-back to etch the second epitaxy material includes a first etch rate of the second epitaxy material and simultaneously a process rate of the first epitaxy material, the process rate being (i) a second etch rate different from the first etch rate, (ii) no growth and no etch, or (iii) a growth rate.

19. A method for forming a semiconductor structure, the method comprising:
forming a first recess and a second recess in a substrate, the substrate having a first lattice constant;
performing a first selective epitaxial growth to simultaneously grow a first semiconductor epitaxy material in the first recess and a second semiconductor epitaxy material in the second recess, with the second semiconductor epitaxial material having a greater growth rate than the first semiconductor epitaxy material, the first semiconductor epitaxy material and the second semiconductor epitaxy material adjoining bottom-most surfaces of the first recess and the second recess, respectively, the first selective epitaxial growth substantially only growing the first semiconductor epitaxy material and the second semiconductor epitaxy material from one or more crystalline surfaces, the bottom-most surfaces of the first recess and the second recess comprising surfaces of the substrate, the first semiconductor epitaxy material and the second semiconductor epitaxy material having a second lattice constant;
after the step of performing the first selective epitaxial growth, performing a selective etch-back on the first semiconductor epitaxy material and the second semiconductor epitaxy material, with the second semiconductor epitaxial material having a greater etch rate than the first semiconductor epitaxy material, wherein the selective etch-back is performed using process gases comprising a first gas for growing the first semiconductor epitaxy material and the second semiconductor epitaxy material, and a second gas for etching the first semiconductor epitaxy material and the second semiconductor epitaxy material; and
performing a second selective epitaxial growth to grow a semiconductor cap material adjoining the first semiconductor epitaxy material and the second semiconductor epitaxy material, the second selective epitaxial growth substantially only growing the semiconductor cap material from one or more crystalline surface, the semiconductor cap material having a third lattice constant, a magnitude of a difference between the first lattice constant and the second lattice constant being greater than a magnitude of a difference between the first lattice constant and the third lattice constant.

20. The method of claim 19, wherein both the first and the second gases are selected from the group consisting essentially of $GeH_4$, HCl, dichloro silane, and combinations thereof.

21. The method of claim 19, wherein both the first and the second gases comprise $GeH_4$, HCl, and DCS.

22. The method of claim 19, wherein after the selective etch-back is performed at least a portion of a top surface of the first semiconductor epitaxy material is at or above a top surface of the substrate.

* * * * *